US007667981B1

(12) United States Patent
Bennett

(10) Patent No.: US 7,667,981 B1
(45) Date of Patent: Feb. 23, 2010

(54) MULTIFUNCTIONAL COMPOSITE SANDWICH ELEMENT WITH EMBEDDED ELECTRONICS

(76) Inventor: Barton E. Bennett, 15270 Timber Trail, Mishawaka, IN (US) 46545

( * ) Notice: Subject to any disclaimer, the term of this patent is extended or adjusted under 35 U.S.C. 154(b) by 0 days.

(21) Appl. No.: 12/052,805

(22) Filed: Mar. 21, 2008

Related U.S. Application Data

(62) Division of application No. 10/690,755, filed on Oct. 22, 2003, now Pat. No. 7,349,225.

(51) Int. Cl.
 *H01R 12/16* (2006.01)
(52) U.S. Cl. .............. 361/790; 361/792; 361/795; 361/748; 361/750; 174/252; 174/255
(58) Field of Classification Search ............ 174/250, 174/252, 255, 260; 361/790–795, 748–751; 257/686–688
See application file for complete search history.

(56) References Cited

U.S. PATENT DOCUMENTS

| | | | |
|---|---|---|---|
| 4,739,443 A | | 4/1988 | Singhdeo |
| 5,184,141 A | | 2/1993 | Connolly et al. |
| 5,384,691 A | | 1/1995 | Neugebauer et al. |
| 5,396,397 A | * | 3/1995 | McClanahan et al. ....... 361/313 |
| 5,432,677 A | | 7/1995 | Mowatt et al. |
| 5,777,381 A | * | 7/1998 | Nishida ...................... 257/693 |
| 5,961,737 A | * | 10/1999 | Glenn ........................ 136/244 |
| 5,979,046 A | | 11/1999 | Glowasky et al. |
| 5,997,998 A | | 12/1999 | Sawamura |
| 6,061,243 A | * | 5/2000 | Barnett et al. ............... 361/704 |
| 6,061,902 A | | 5/2000 | Kalamkarov et al. |
| 6,066,389 A | | 5/2000 | Glowasky et al. |
| 6,144,899 A | * | 11/2000 | Babb et al. .................... 701/3 |
| 6,188,582 B1 | | 2/2001 | Peter |
| 6,222,265 B1 | | 4/2001 | Akram et al. |
| 6,246,013 B1 | | 6/2001 | Yoshida et al. |
| 6,268,049 B1 | * | 7/2001 | Childress ................. 428/309.9 |
| 6,292,366 B1 | | 9/2001 | Platt |
| 6,304,450 B1 | * | 10/2001 | Dibene et al. ............... 361/704 |
| 6,404,044 B2 | | 6/2002 | Akram et al. |
| 6,447,880 B1 | * | 9/2002 | Coppens ..................... 428/174 |
| 6,538,210 B2 | | 3/2003 | Sugaya et al. |
| 6,625,880 B2 | | 9/2003 | Nabemoto et al. |
| 6,784,530 B2 | | 8/2004 | Sugaya et al. |
| 2002/0117743 A1 | | 8/2002 | Nakatani et al. |

\* cited by examiner

*Primary Examiner*—Dean A. Reichard
*Assistant Examiner*—Hoa C Nguyen
(74) *Attorney, Agent, or Firm*—Baker & Daniels LLP

(57) ABSTRACT

A composite sandwich structure carrying an externally applied structural load and having embedded electronics, that in one embodiment includes two multilayered composite facesheet laminates, a central core, embedded electronic components within the central core region, embedded electrical conductors within the central core region, and two multilayer printed circuit laminates that are secondarily bonded or cured to the inner surface of the sandwich facesheet laminates. The electronic components and electrical conductors, which are located in the central core region of the sandwich element, are attached to one or both of the two circuit laminates.

14 Claims, 14 Drawing Sheets

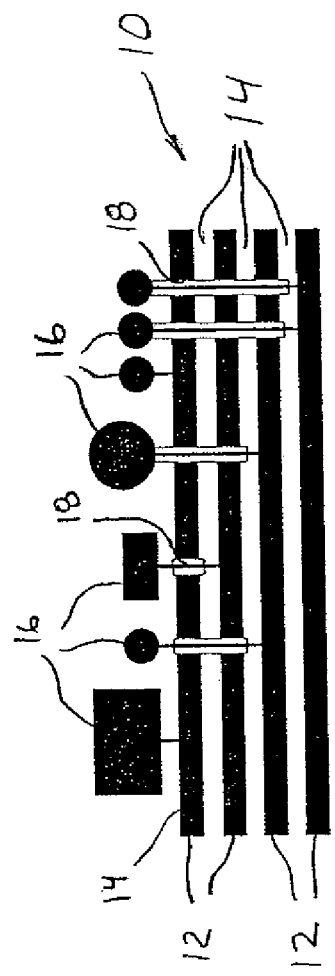
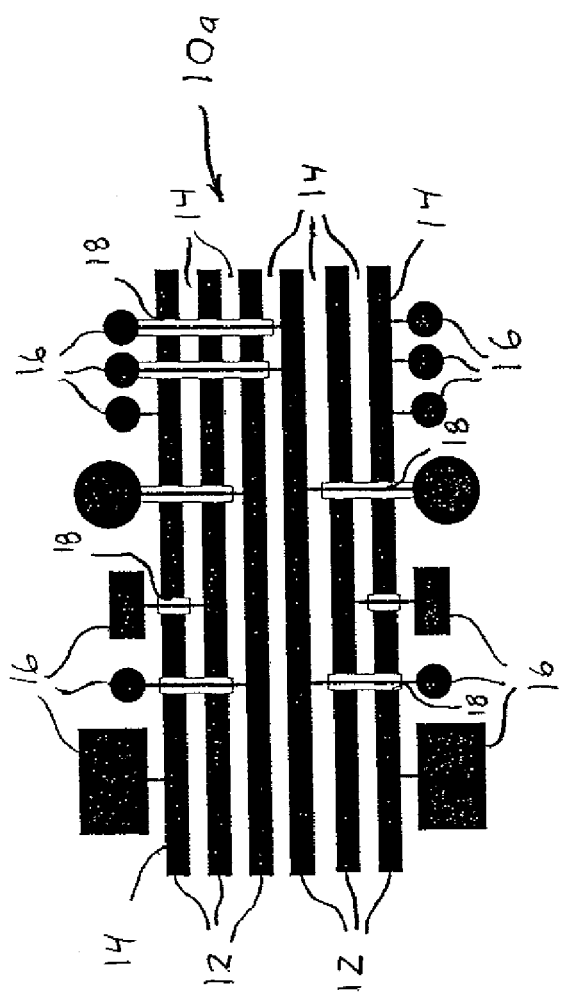
FIG. 1A (Prior Art)
FIG. 1B (Prior Art)

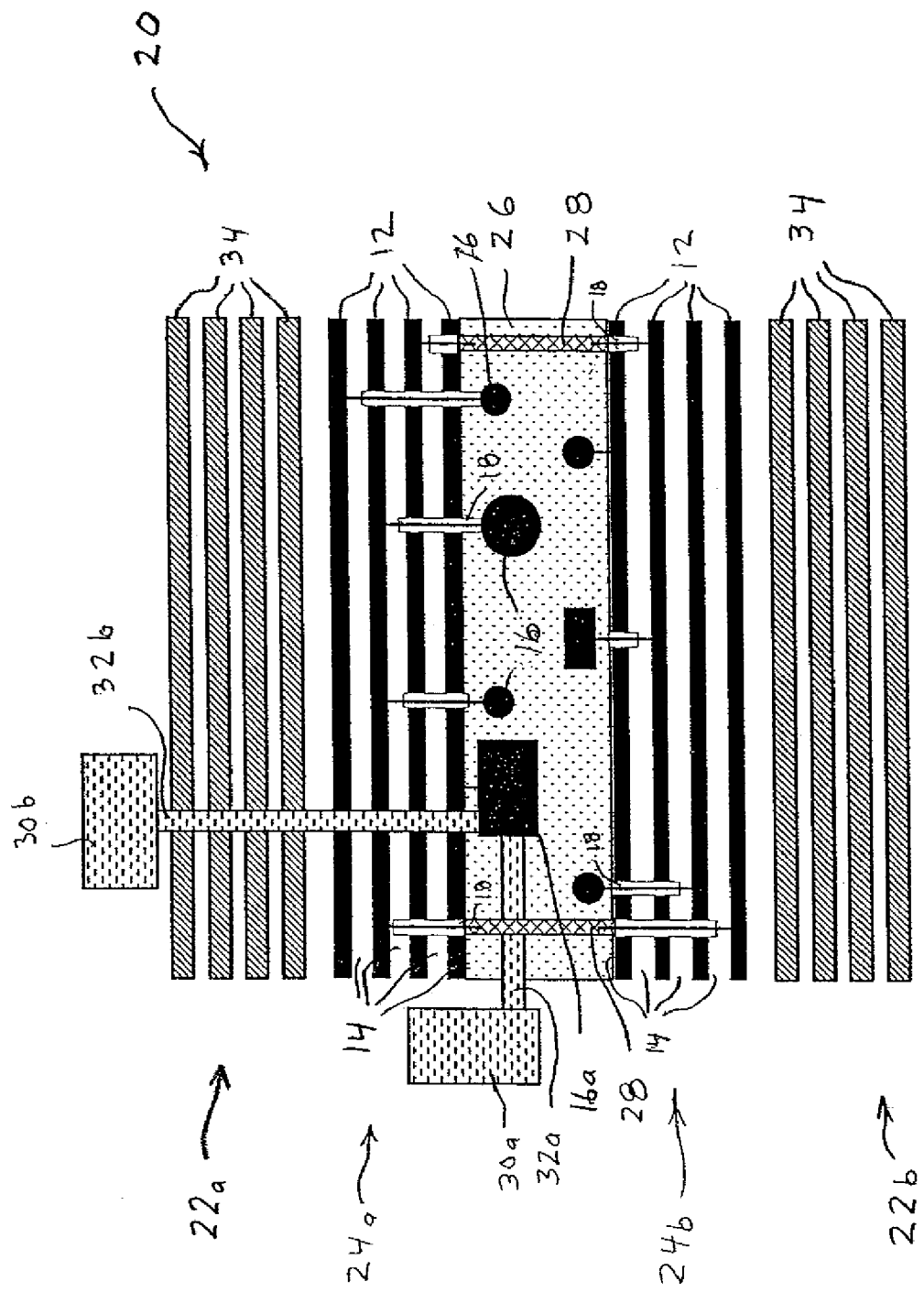

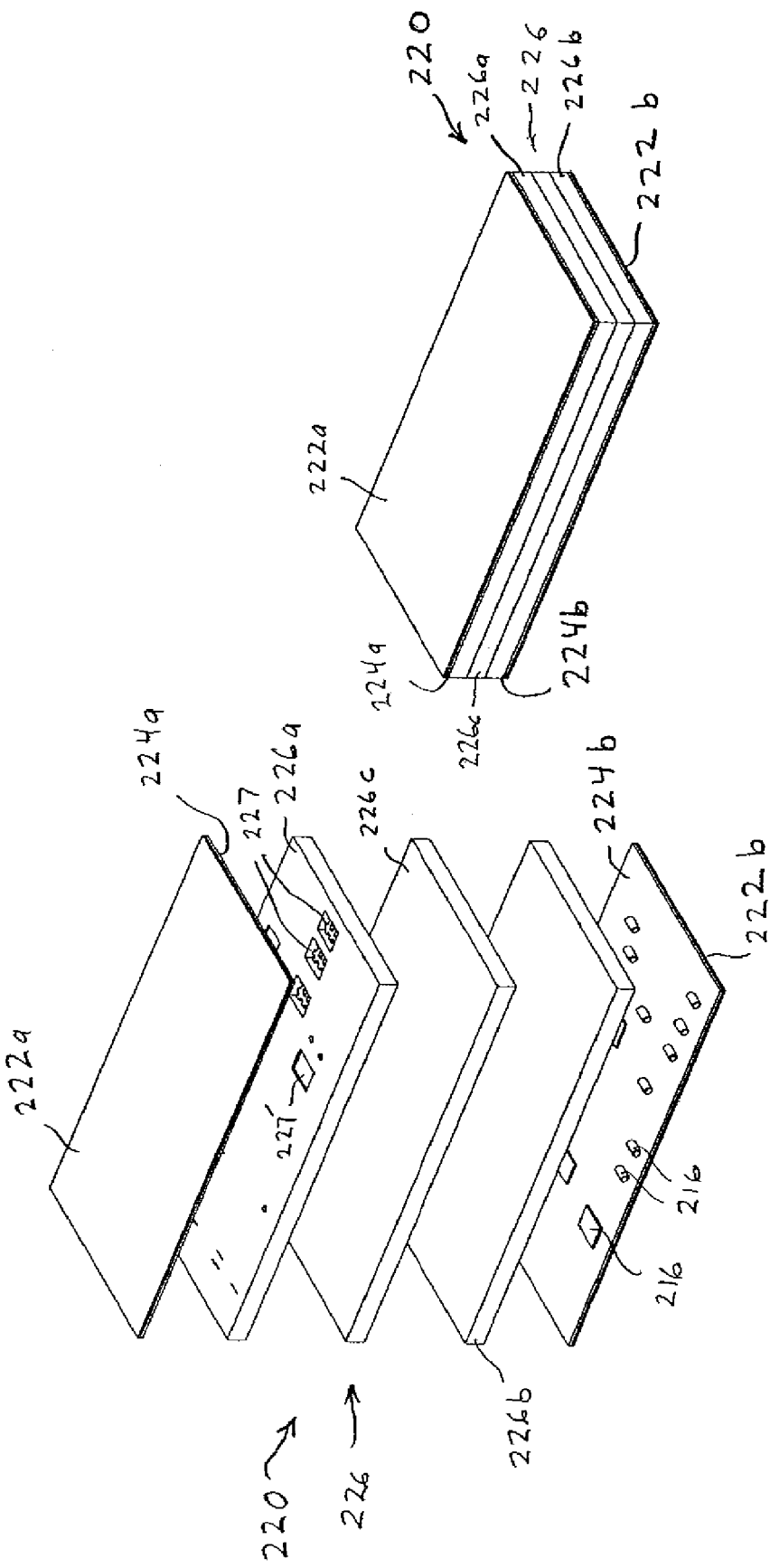

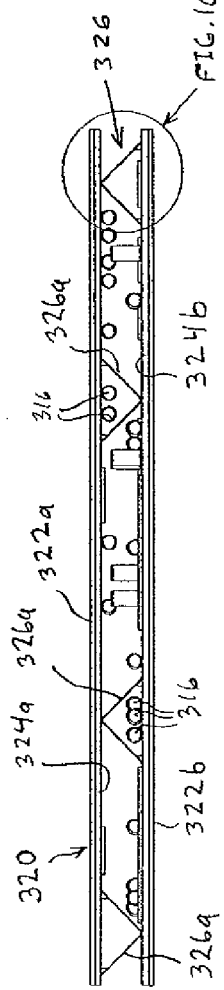
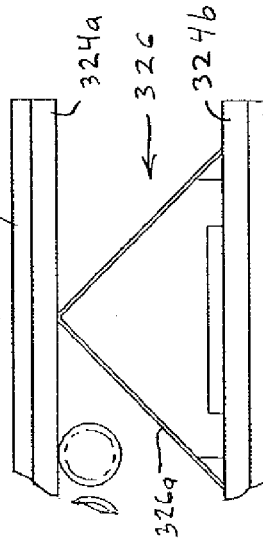
FIG. 10
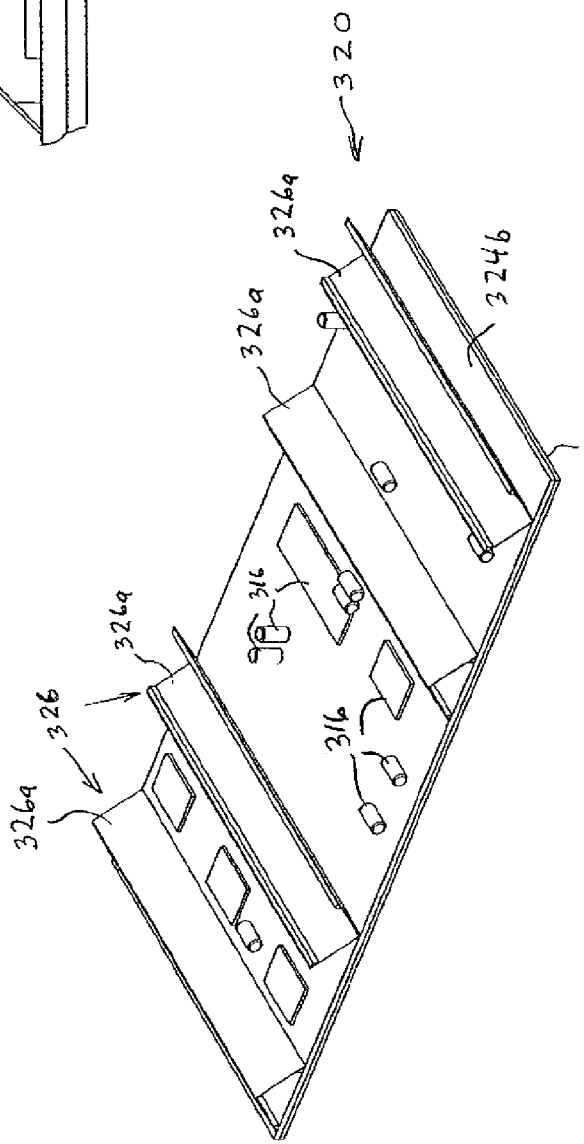
FIG. 8
FIG. 9

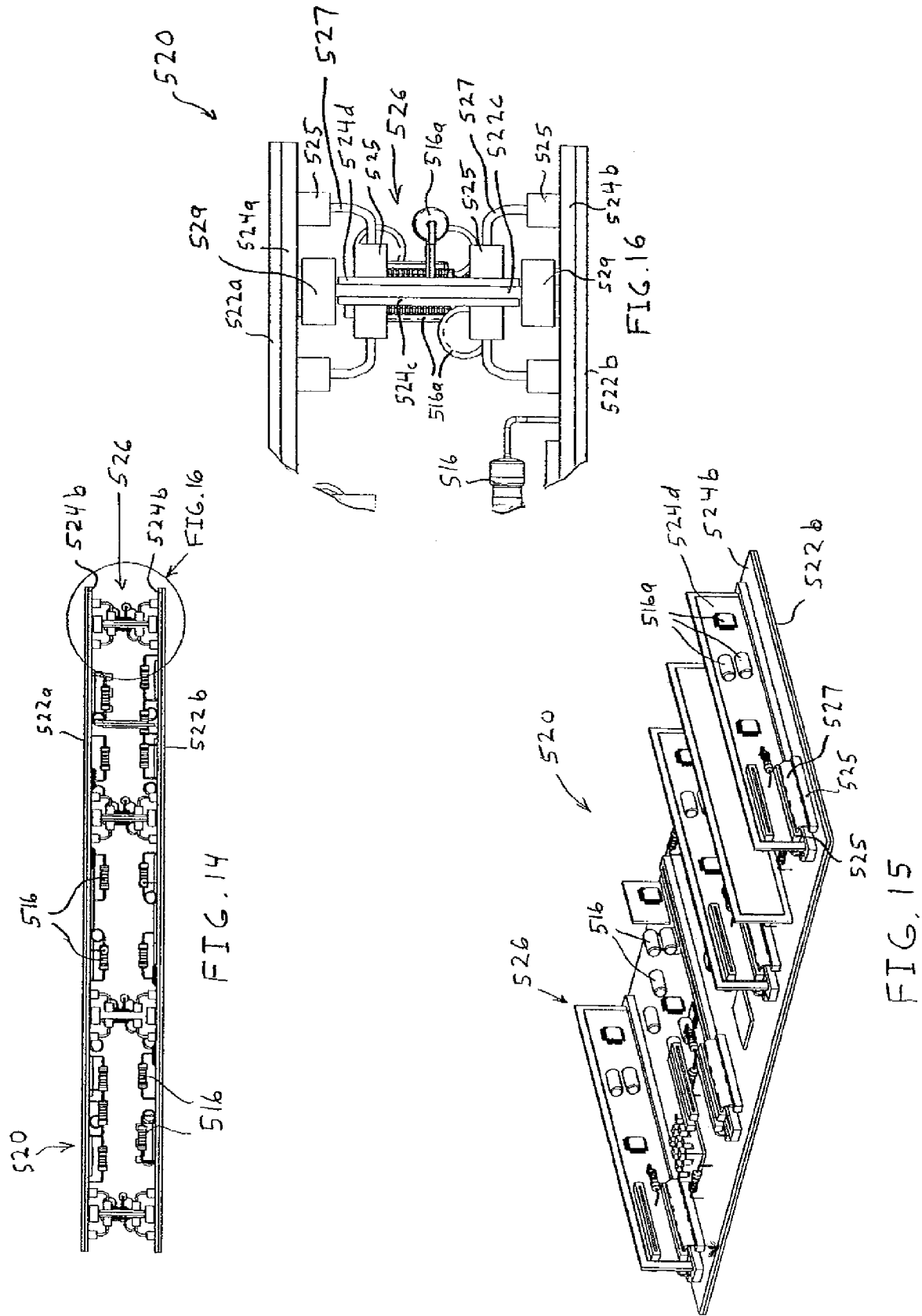

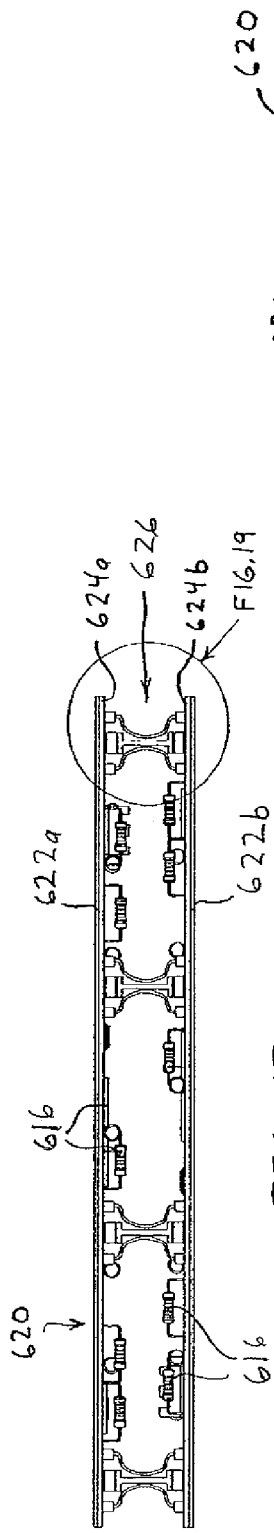
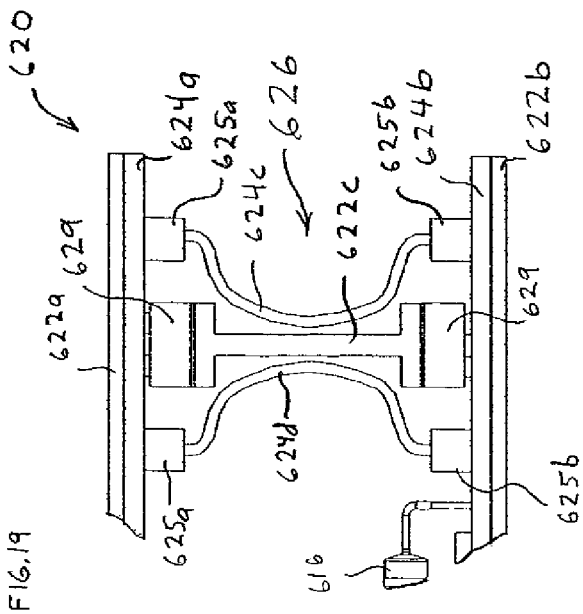
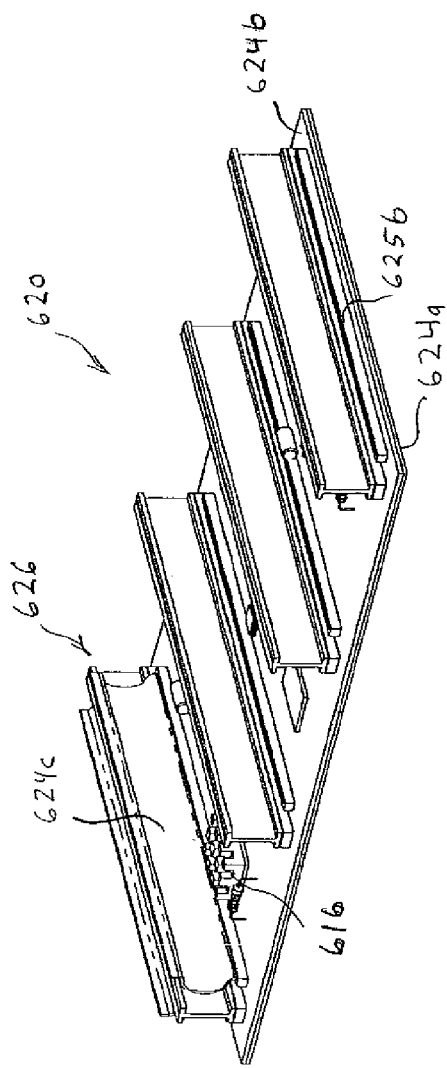

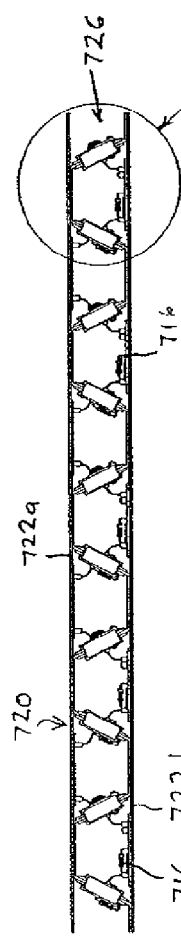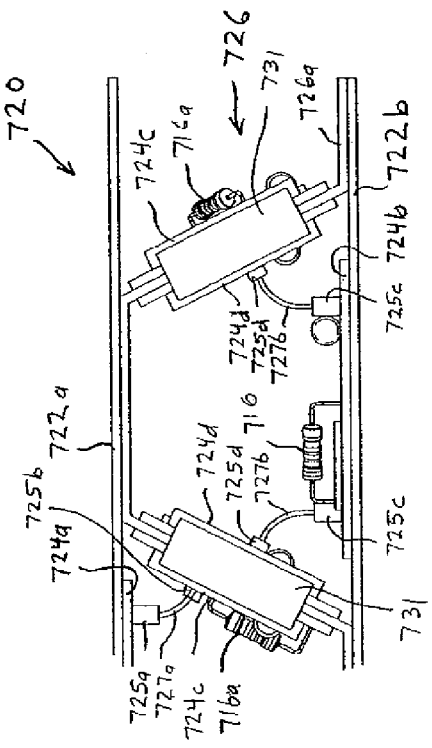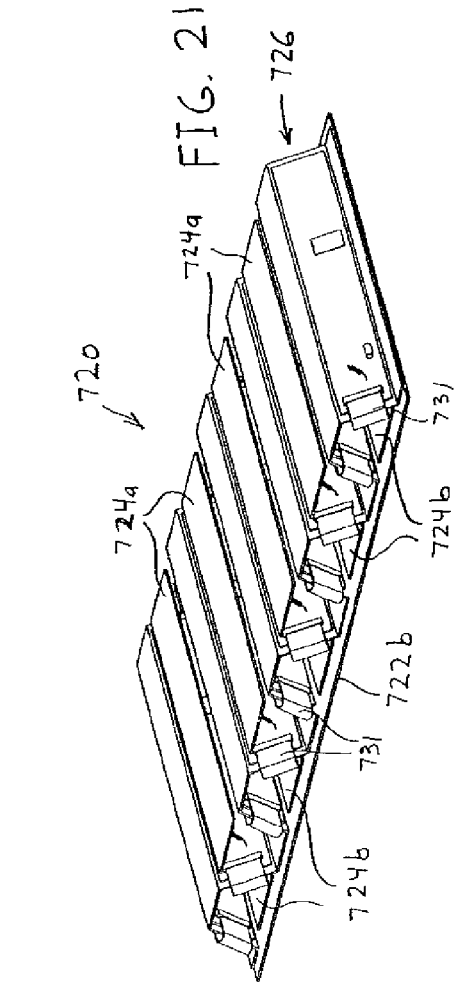

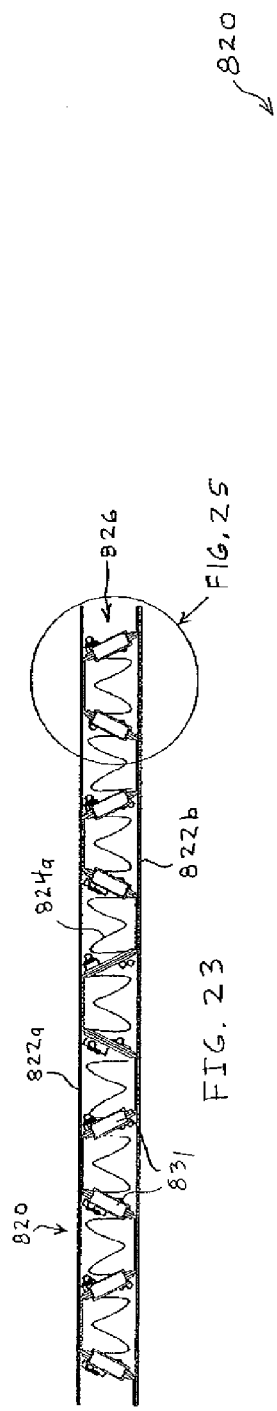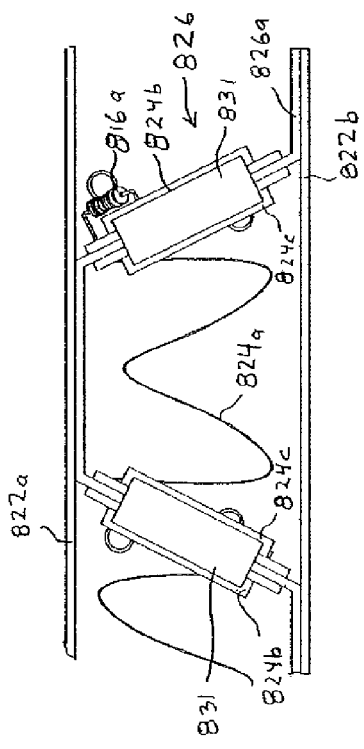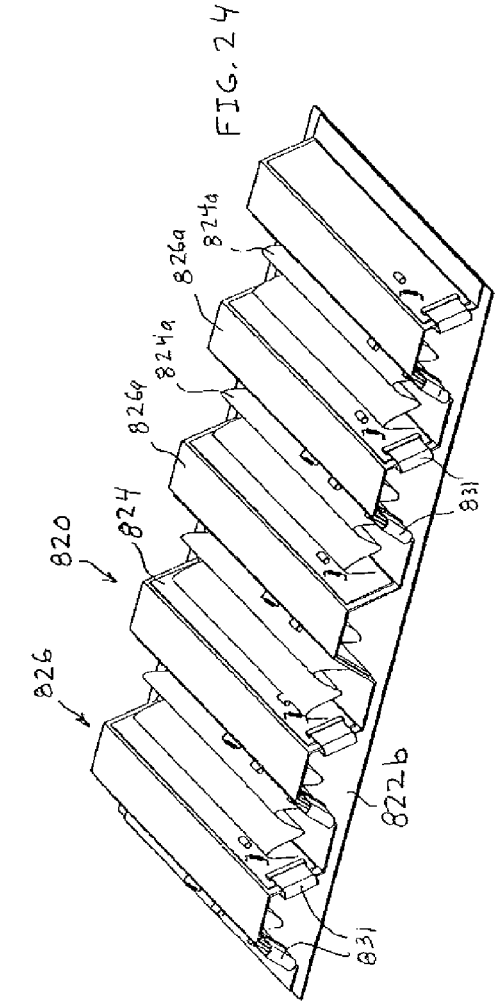

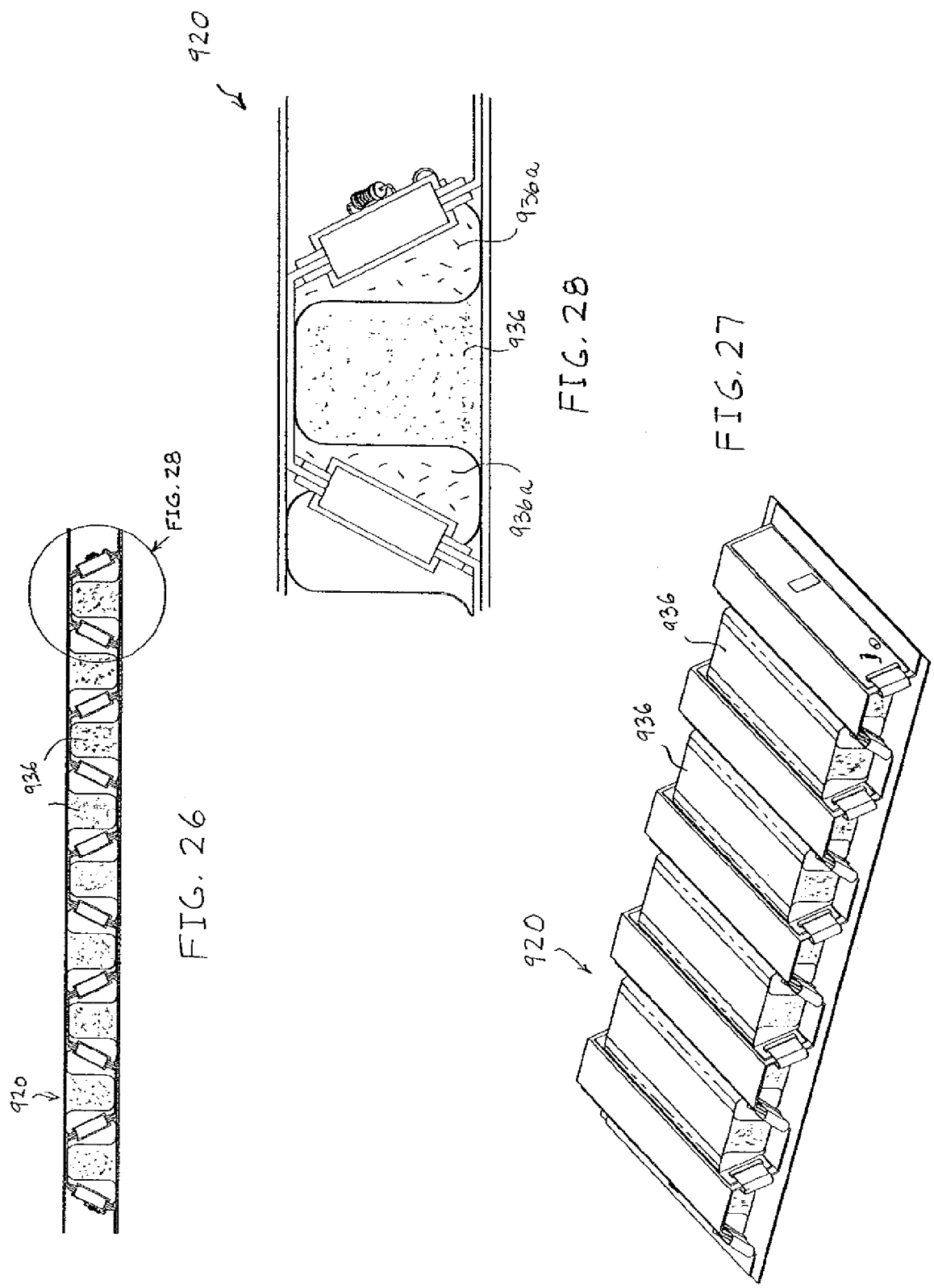

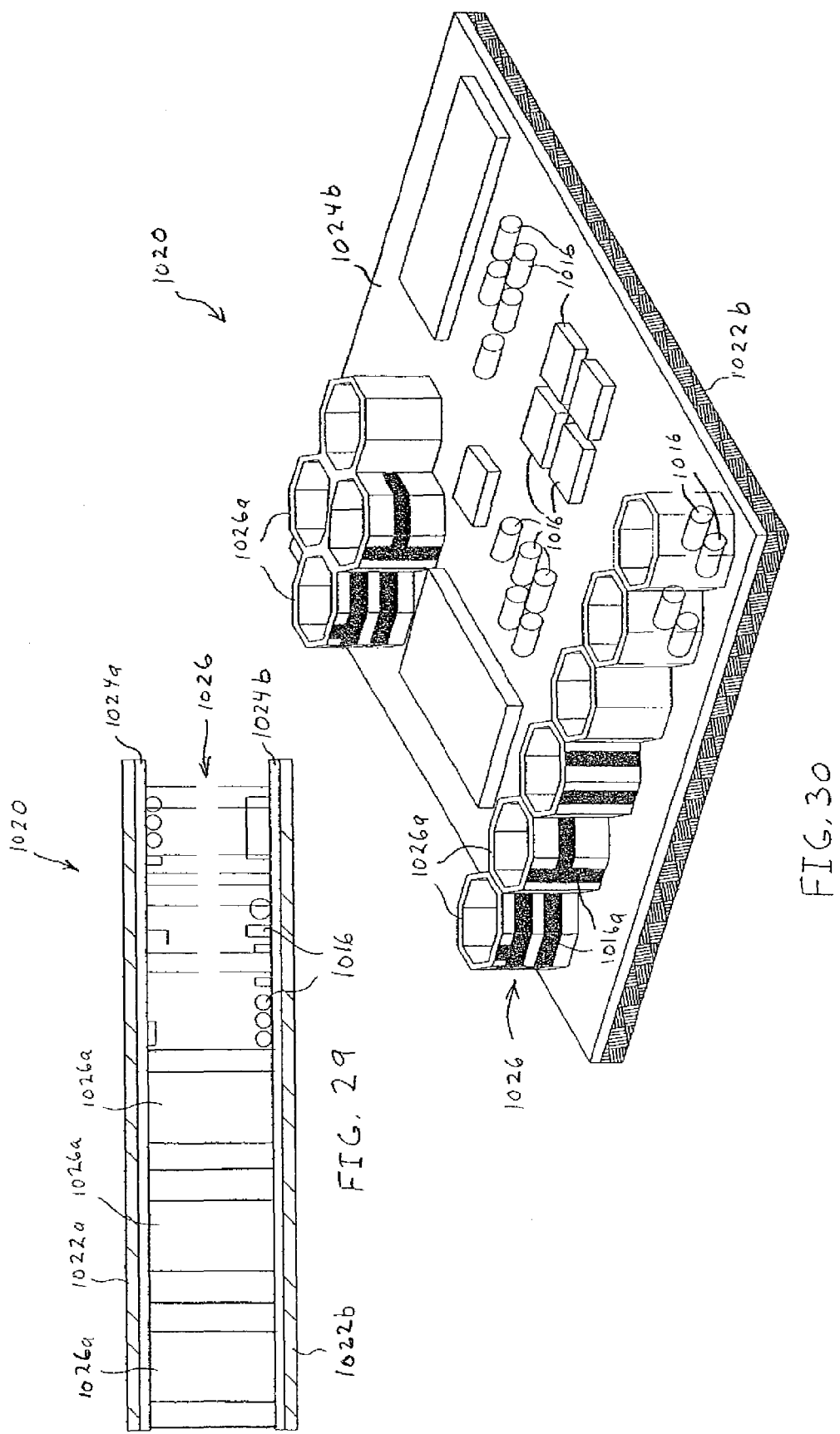

MULTIFUNCTIONAL COMPOSITE SANDWICH ELEMENT WITH EMBEDDED ELECTRONICS

This Divisional application claims the benefit of United States Utility patent application Ser. No. 10/690,755 filed Oct. 22, 2003, the complete disclosure of which is hereby expressly incorporated by reference.

BACKGROUND OF THE INVENTION

The present invention pertains to a multilayered composite sandwich structure with embedded electronics, which can be used as flat sandwich circuit cards, multifunctional structure with embedded electronics or avionics, and complex shaped component housings with embedded electronics. Some examples of uses include aircraft sandwich bulkhead structure with embedded avionics, automotive instrument display panels with embedded electronics, aircraft instrument consoles, and flat sandwich circuit cards.

Circuit boards are one type of known composite structure that include electronics and may have composite materials with low dielectric properties. Electrical grade composite laminates are produced using a large variety of reinforcements, resin systems and thickness depending on end usage. Laminates are produced by stacking sheets of prepreg (fiber preforms pre-impregnated with resin) between pre-treated copper foils of the desired thickness. A common type of printed circuit board produced today is a multilayered board made of fiberglass and epoxy resin called "G10-FR4." Most circuit boards, which are exposed to temperature fluctuations, are limited in thickness and the number of embedded circuits due to mismatch in coefficients of thermal expansion (CTE) between the vertical through hole via conductors and the laminate. This causes the number of circuit layers in a circuit card to be limited to prevent excessive thermal expansion and resulting via conductor cracking. The CTE mismatch in conjunction with thermal distortion of the laminate causes cyclic strain on the solder joints of the electronic components. In harsh environments, thermal distortion of the board, CTE mismatch, and vibration result in solder joint fatigue failure.

Another type of known composite structure and one that may be utilized with the present invention is a polymer structural composite that may include carbon or glass fiber reinforced polymers that can be fabricated at relatively low temperatures. In most aerospace applications, these structures are fabricated by laying up multiple layers of carbon fabric or unidirectional materials to form laminate structure. In other applications, such as most automotive or transportation uses, the composite structures are made by placing chopped and often randomly oriented fibers onto a mold. These fabric or random fiber preforms are then resin infused, if not already impregnated with resin prior to lay-up onto the mold tooling, and then cured to create a rigid structure.

It is also known to bond composite laminates to each side of a core material to make composite sandwich structures. An example of one type of sandwich structure is corrugated cardboard. Composite structures as discussed above may also be made into such a sandwich structure to create a lightweight yet stiff structure. The most common core materials include honeycomb cores, foams, and cellulous materials. Additionally, it should be appreciated that fabricating a composite structure includes the process of incrementally building up the material constituents onto mold tooling and may provide an opportunity to embed electronic components and their circuitry.

Presently, in aircraft, the electronics, which are commonly referred to as avionics, are not provided in the structural composite structures, but rather, housed in avionics boxes. These boxes are placed in avionics racks. The cost and weight of these boxes and racks can be substantial. The circuit cards provide the single function of securing the electronic components and circuitry and do not contribute to the strength or stiffness of the aircraft structure. In automobile instrument panels and aircraft instrument consoles, electronic circuit cards are attached to the back of the panels or consoles and do not carry any load and do not contribute to the strength or stiffness of the assembly. It is, therefore, an object of the invention to provide a composite structure with embedded electronics. It is also an object of the invention that the electronics may be in embedded in structural composite structures such as found in aircraft. A further object of the invention is to reduce or eliminate the need and cost of avionics boxes by incorporating the avionics into composite structures.

SUMMARY OF THE INVENTION

It is believed that these and other objects of the invention have been met by providing in one embodiment, a multilayered composite sandwich element with embedded electronics and circuitry. The sandwich element includes sequentially attached layers with multilayer composite facesheet laminates that may be made of structural fiber reinforced material, multilayer circuit laminates made of low dielectric fiber reinforced material with electrically conducting printed circuits embedded between low dielectric plies, and electronic components located in a central core region with electrical conducting pins that are in contact with and secured to the printed circuits. The core material may be used to transfer shear and provide stiffness in conjunction with the facesheet laminates.

The invention is usable as sandwich circuit boards, multifunctional structure with embedded electronic components and circuitry, and multifunctional housings with embedded electronic components and circuitry.

When used as flat sandwich circuit cards, it is believed that this invention provides greater stiffness over related art. The added stiffness may help prevent thermal distortion and reduce the problem of solder joint fatigue. In addition, the added stiffness may increase the natural frequency of the circuit card and reduce the potential for vibratory isolation of the sandwich element. In one embodiment, the construction provides protection to the electronic components by embedding them inside the core. The core may optionally be porous to introduce airflow through the core to cool electronic components that generate heat. One embodiment of the invention has two laminates with known embedded printed circuitry, which allows for a greater density of circuitry. The electronic components may be attached to either circuit laminate by surface or pin mounting.

When used as a multifunctional structure with embedded electronics, the invention may reduce or eliminate the need for electronic housing boxes and supporting racks. The application of the invention to aircraft structure may reduce or eliminate the avionics boxes and avionics racks. This may result in a substantial decrease in weight and cost. In addition, the invention results in a sandwich circuit construction that may be load carrying and contributes to the stiffness and strength of the aircraft structure.

When used as multifunctional housings with embedded electronic components and circuitry, the invention may eliminate some assembly operations and reduce costs. In addition, because the sandwich circuit elements are part of the housing structure and contribute to its strength and stiffness, this may result in weight savings.

Because the electronic components may not be as accessible as the related art, this invention may include redundant and re-configurable electronics. This allows defective components or circuits to be isolated and like components or circuits to be used in its place.

In one embodiment, the invention includes heat sinks that contact heat generating electronic components and extend outside the sandwich element to exhaust the heat. If there is adequate airflow through the core, a heat sink may not be required. In certain designs where there is airflow through the core but additional heat dissipation is required, the heat sinks may reside wholly inside the core area without extending outside the sandwich element.

BRIEF DESCRIPTION OF THE DRAWINGS

The above-mentioned and other features and objects of this invention and the manner of obtaining them will become more apparent and the invention itself will be better understood by reference to the following description of an embodiment of the present invention taken in conjunction with the accompanying drawings, wherein:

FIG. 1A is a schematic cross-section of a prior art single-sided printed circuit board;

FIG. 1B is a schematic cross-section of a prior art double-sided printed circuit board;

FIG. 2 is a schematic cross-section of one embodiment of a composite sandwich structure of the present invention with the laminate layers exploded for clarity;

FIG. 6 is an isometric perspective view of another embodiment of a composite sandwich structure having a hybrid core;

FIG. 7 is an exploded perspective view of the composite sandwich structure of FIG. 6;

FIG. 8 is a side view of another embodiment of a composite sandwich structure having angled trusses;

FIG. 9 is a perspective view of the composite sandwich structure of FIG. 8 with the top portion removed for clarity;

FIG. 10 is an enlarged view of a portion of the composite sandwich structure from the area indicated in FIG. 8;

FIG. 14 is a side view of yet another embodiment of a composite sandwich structure of the present invention;

FIG. 15 is a perspective view of the composite sandwich structure of FIG. 14 shown with the top portion removed for clarity;

FIG. 16 is an enlarged view of a portion of the composite sandwich structure from the area indicated in FIG. 14;

FIG. 17 is a side view of a further embodiment of a composite sandwich structure of the present invention;

FIG. 18 is a perspective view of the composite sandwich structure of FIG. 17 shown with the top portion removed for clarity;

FIG. 19 is an enlarged view of a portion of the composite sandwich structure from the area indicated in FIG. 17;

FIG. 20 is a side view of an additional embodiment of a composite sandwich structure of the present invention;

FIG. 21 is a perspective view of the composite sandwich structure of FIG. 20 shown with the top portion removed for clarity;

FIG. 22 is an enlarged view of a portion of the composite sandwich structure from the area indicated in FIG. 20;

FIG. 23 is a side view of another embodiment of a composite sandwich structure of the present invention;

FIG. 24 is a perspective view of the composite sandwich structure of FIG. 23 shown with the top portion removed for clarity;

FIG. 25 is an enlarged view of a portion of the composite sandwich structure from the area indicated in FIG. 23;

FIG. 26 is a side view of still another embodiment of a composite sandwich structure of the present invention;

FIG. 27 is a perspective view of the composite sandwich structure of FIG. 26 shown with the top portion removed for clarity;

FIG. 28 is an enlarged view of a portion of the composite sandwich structure from the area indicated in FIG. 26;

FIG. 29 is a side view of another embodiment of a composite sandwich structure of the present invention; and FIG. 30 is a perspective view of the composite sandwich structure of FIG. 29 shown with the top portion removed for clarity.

Figure 3:
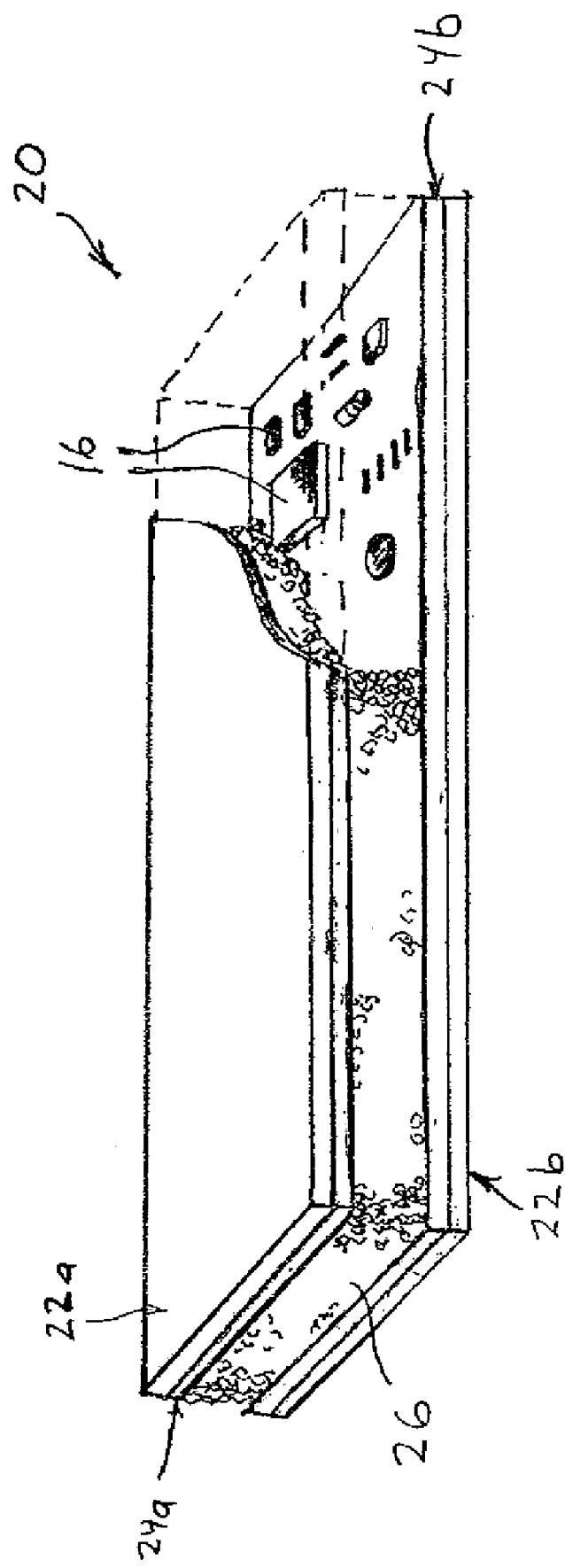
FIG. 3 is a perspective view of the composite sandwich structure of FIG. 2 with a portion of the structure removed for illustration.

Corresponding reference characters indicate corresponding parts throughout the several views. Although the drawings represent embodiments of the present invention, the drawings are not necessarily to scale and certain features may be exaggerated in order to better illustrate and explain the present invention. The exemplification set out herein illustrates an embodiment of the invention, in one form, and such exemplifications are not to be construed as limiting the scope of the invention in any manner.

DETAILED DESCRIPTION OF EMBODIMENTS OF THE INVENTION

For the purposes of promoting an understanding of the principles of the invention, reference will now be made to the embodiments illustrated in the drawings and specific language will be used to describe the same. It will nevertheless be understood that no limitation of the scope of the invention is thereby intended. The invention includes any alterations and further modifications in the illustrated devices and described methods and further applications of the principles of the invention which would normally occur to one skilled in the art to which the invention relates.

Referring now to FIG. 1A, a prior art single-sided circuit board is generally indicated as 10. Circuit board 10 has a laminate structure including laminate sheets or plies 12 and layers of electrically conductive traces or circuits 14 intermittent to laminate sheets 12. Laminate sheets 12 can be made from a low dielectric material such as prepreg, which may include fiber preforms, which are pre-impregnated with a resin such as epoxy, or the laminate sheets may include other known low dielectric materials such as ceramic and polymers. Conductive circuits 14 may typically be made from copper foil of the desired thickness, which has been chemically etched, laser cut, or otherwise formed into a circuit layer having the desired electrical paths. Other known conductive circuits (14) may be made of electrically conductive films, inks, polymers and other metals. Circuit board 10 also includes miscellaneous electronic components or devices 16, which may include, but are not limited to, microchips, resistors, capacitors and inductors, and electrically conductive vias 18 which provide an electrical path from electronic components 16 to conductive circuits 14. It should be noted that in FIG. 1, electronic components 16 are all mounted from one side of the uppermost laminate sheet 12, which also include conductive circuits 14 thereon. It should also be noted that electronic components 16 may either be surface or pin mounted as is known.

In FIG. 1B, a double-sided circuit board, generally indicated as 10a, includes laminated sheets 12, layers of conductive circuits 14, electronic component 16, and electrically conductive vias 18. Circuit board 10a is similar to circuit board 10 except that electronic components 16 are mounted from both the outer upper and lower laminate sheets 12, and conductive vias 18 extend into circuit board 10a from both the outermost upper and lower laminate sheets 12.

Now referring to FIGS. 2 and 3, one embodiment of a multilayered composite sandwich structure of the present invention is generally indicated as 20. Composite sandwich structure 20 includes outer facesheet structural laminates, generally indicated as 22a, 22b, intermediate circuit laminates, generally indicated as 24a, 24b, and a core structure 26. Composite sandwich structure 20 also includes electronic components 16, heat generating devices or components 16a, conductive vias 18, circuit leads 28, and heat sinks 30a, 30b having heat sink leads 32a, 32b, respectively. Structural laminates 22a, 22b may be polymer composite structures that include carbon or glass fiber reinforced polymer layers 34, which can be fabricated at relatively low temperatures. The fibers may either run continuously across the length of the layer as is typical in aerospace applications, or the fibers may be chopped and randomly oriented as is common in automotive and transportation uses. These types of fiber reinforced structures are typically layered together with a pre-impregnated or later infused resin and then cured by heat or other means to create a rigid structure. It should be appreciated, however, that the invention is not limited to any specific structural composite laminates and may utilize any suitable materials.

Intermediate circuit laminates 24a, 24b are manufactured from materials having low dielectric properties and include laminate sheets or plies 12 and layers of electrically conductive traces or circuits 14 as discussed above for circuit boards 10 and 10a. Of course, other suitable low dielectric materials may be utilized for laminate sheets 12, such as Teflon, ceramics, and polymers.

Core 26 may be an open or closed cell foam, cellulous material, honeycomb core, or other structural core. An open cell foam or other porous structure that is thermally conductive can be used for the core to help facilitate cooling of electronic components 16 and heat generating devices 16a.

Circuit leads 28 are employed to electrically connect circuit laminate 24a to circuit laminate 24b. Any well-known electrically conductive materials, such as copper or aluminum, may be used for circuit leads 28, and the circuit leads may be electrically connected to intermediate conductive circuit layers 14 using vias 18, the same as the vias are used for connecting electronic components 16 to said conductive circuit layers.

Heat sinks 30a and/or 30b may be used if air flow through core 26 is not adequate to cool heat generating components 16a. Heat sinks 30a and 30b provide composite sandwich structure 20a with the capacity to dissipate additional generated heat, and may be placed at the outer edges of core 26, such as heat sink 30a with heat sink lead 32a thermally connecting heat generating component 16a through the length or partial length of core 26 to heat sink 30a. Alternately, or in addition to, heat sink 30b may be located upon the exterior of either structural laminate 22a and/or structural laminate 22b, with heat sink lead 32b extending through laminate sheets 12 and composite layers 34 to thermally connect heat generating component 16a with heat sink 30b. Heat sinks 30a, 30b and heat sink leads 32a, 32b can be made with any known materials having a high thermal conductivity, such as copper or aluminum. Of course, if the heat sink leads are made from an electrically conductive material, care should be taken to electrically isolate them from conductive circuits 14 and circuit leads 28.

To assemble composite sandwich structure 20, circuit laminates 24a and 24b may be fabricated and electronic components 16 and heat generating device 16a attached using known techniques as discussed above. Openings may be placed in the core 26 to accommodate electronic components 16, heat generating devices 16a, circuit leads 28, and heat sink leads 32a, 32b, or the core material may be placed around those component parts or formed around the component parts in the case such as a foam core. As discussed above, structural laminates 24a, 24b may be formed using known techniques of pressing layers of composite material together with an impregnated resin or added resin. However, it may be desirable to postpone curing structural laminates 22a, 22b until after they have been joined with circuit laminates 24a, 24b, respectively. Impregnated or infused resin may then be used to join structural laminates 22a, 22b to circuit laminates 24a, 24b, respectively, and cured to create a rigid structure. Another option for fabricating the structure is to fully cure the resin in the laminates prior to joining the structural and circuit laminates, and then bond the respective structural and circuit laminates together with an adhesive.

Figure 4:
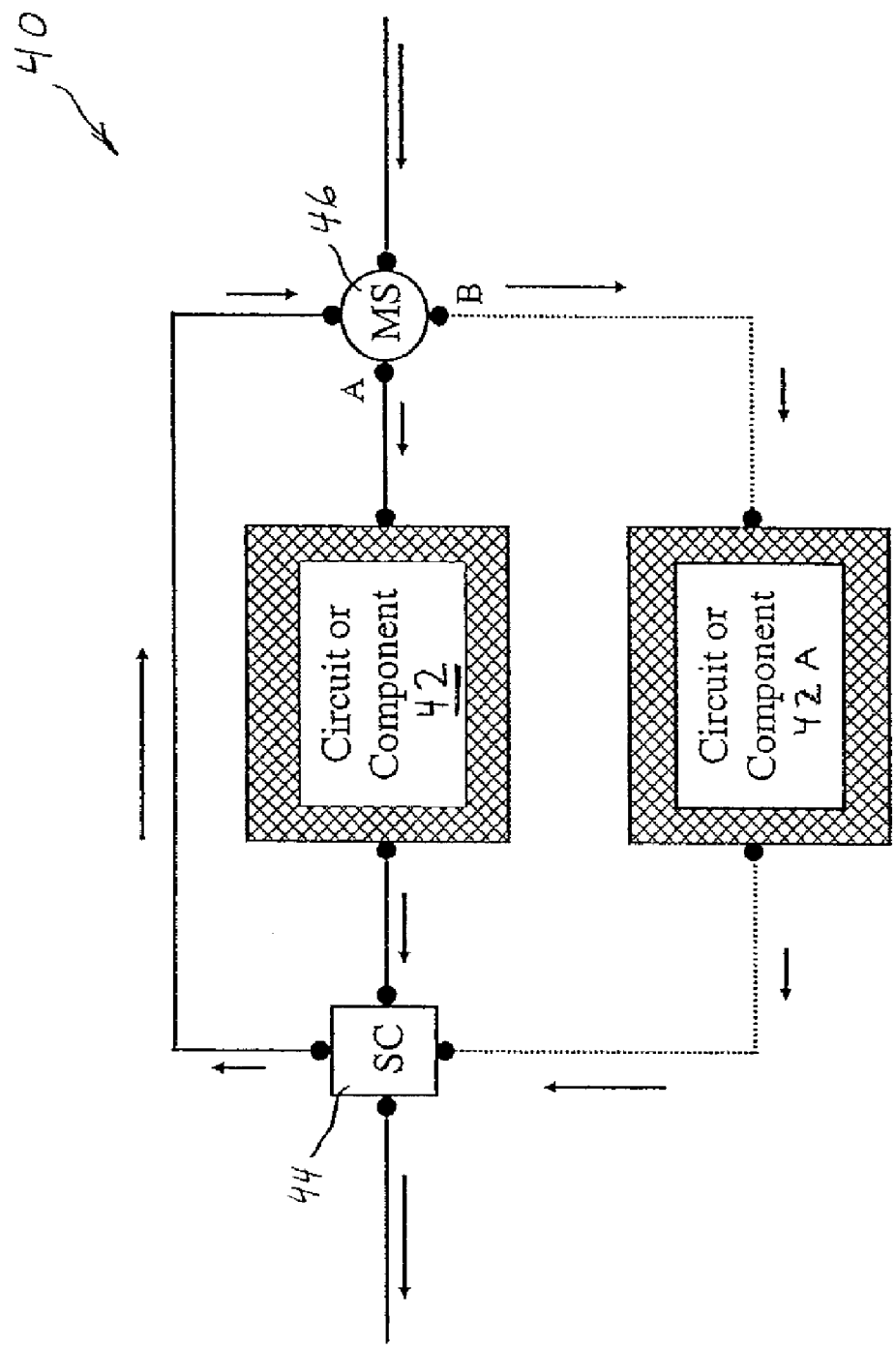
FIG. 4 is a schematic illustration of a reconfigurable and redundant circuit and an associated control circuit.

In operation, composite sandwich structure 20 provides both structural support to the automobile structure, aircraft, or other member in which it is employed while at the same time providing a safe, secure, lightweight, and vibration-resistant housing for electronic components and/or avionics 16. However, as composite sandwich structure 20 may limit access to replace or repair any failed or malfunctioning components or circuitry, reconfigurable and redundant circuitry 40 (FIG. 4) may be provided for electronic components 16, 16a, conductive circuits 14, and circuit leads 28. Reconfigurable and redundant circuitry 40 may include a circuit and/or component 42, a redundant circuit and/or component 42a, a signal control device 44, and a micro switch 46. Initially, circuit and/or components 42 will be active. If circuit or component 42 fails or malfunctions, then an unacceptable reading will occur at the signal control device 44, which triggers the activation of micro switch 46. Micro switch 46 isolates the failed circuit or component 42 by disconnecting circuit A and opening circuit B to the redundant circuit or component 42a.

Figure 5:
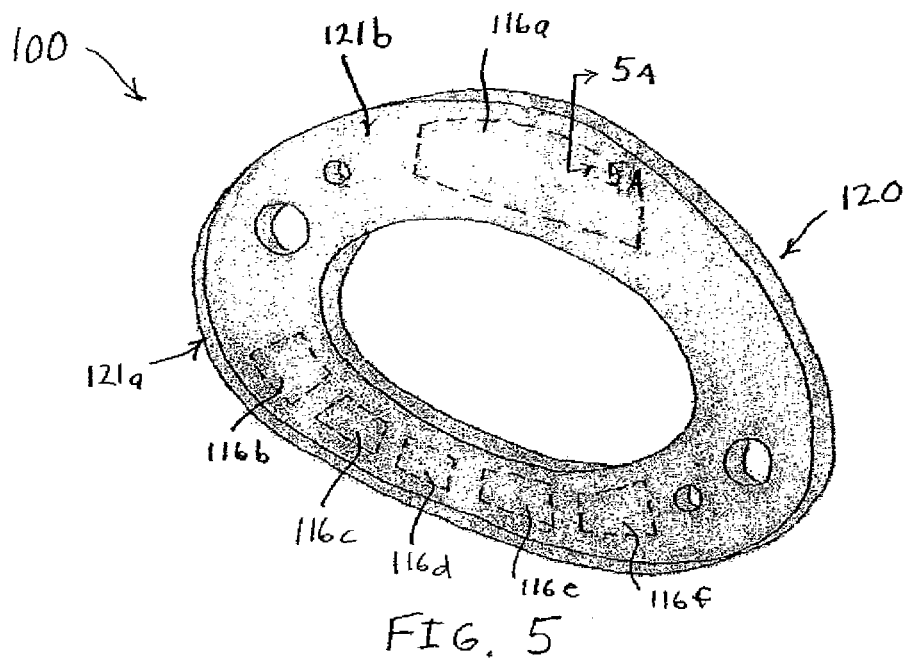
FIG. 5 is a perspective view of an aircraft bulkhead with embedded avionics according an embodiment of the present invention.
Figure 5A:
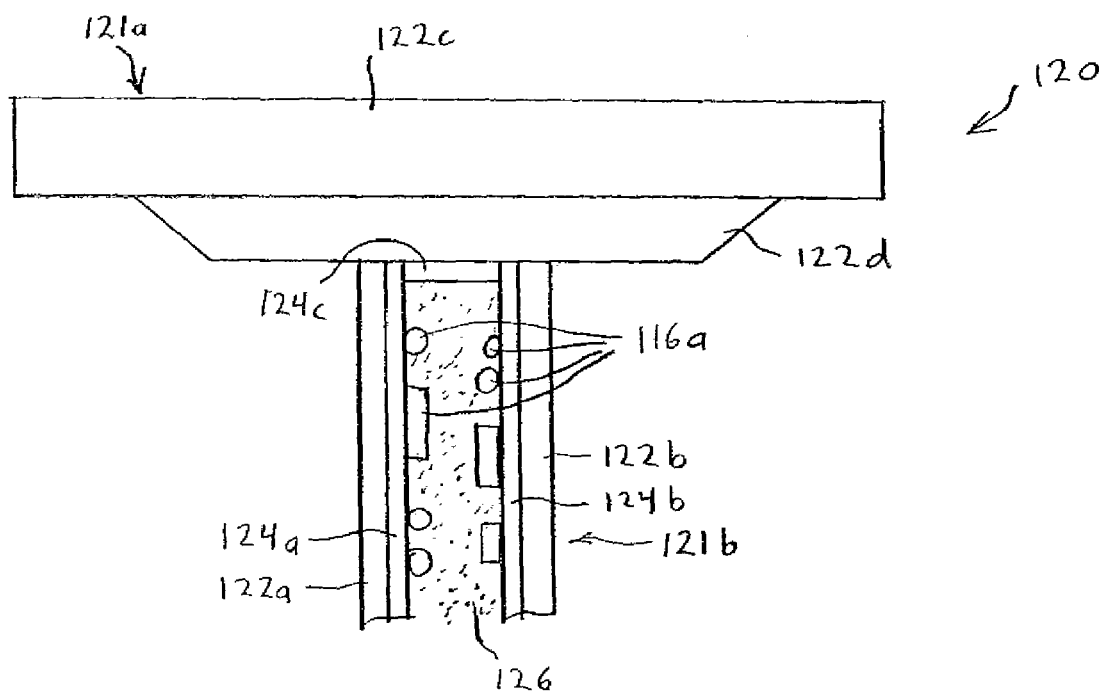
FIG. 5A is a cross-sectional view of the aircraft bulkhead with embedded avionics taken along line 4A-A of FIG. 4.

Now referring to FIGS. 5 and 5A, an aircraft bulkhead is generally indicated as 100. Aircraft bulkhead 100 includes electronic components or devices 116a-f (shown in phantom lines in FIG. 5) contained within a multilayer composite structure, generally indicated as 120. Composite structure 120 includes a flange portion, generally indicated 121a, and a web portion, generally indicated as 121b. Web portion 121b is similar to composite sandwich structure 20 and includes structural laminates 122a, 122b, circuit laminates 124a, 124b, and a core structure 126. Flange portion 120a includes an outer structural laminate 122c, and inner structural laminate 122d, and a circuit laminate 124c electrically connecting the circuit laminates 124a and 124b. In addition to or instead of circuit laminate 124c, circuit leads, such as leads 28 in composite sandwich structure 20, may be used to connect circuit laminates 124a and 124b. It should be realized that electronic components 116a-116f in aircraft bulkhead 100 may include reconfigurable and redundant circuitry 40 as discussed above.

Another embodiment of a composite sandwich structure having a hybrid core is shown, generally indicated as 220, in FIGS. 6 and 7. Composite sandwich structure 220 has outer structural laminates 222a, 222b, which may be a polymer composite or other laminate structure as discussed above, and intermediate circuit laminates 224a, 224b, which include a low dielectric material as discussed above, such as a glass fiber laminate. Composite sandwich structure 220 also includes electronic components or devices 216 and a hybrid core structure, generally indicated as 226. In the embodiment shown, hybrid core structure 226 has outer core members 226a, 226b and an inner core member 226c. The core members may include core openings 227 spaced and configured to receive electronic components 216. Core members 226a-c may be made of a single or different core materials. For example, inner core member 226c may be a porous or open cell material to facilitate air flow for convected heat transfer, while outer core members 226a, 226b may be a material that is amenable to mechanical or other types of removal in order to repair or upgrade electronic components 216. It should also be appreciated that core openings 227 help to facilitate convected heat transfer if one or more of the core members includes a porous or open cell material.

Now referring to FIGS. 8-10, another composite sandwich structure is shown, generally indicated as 320. Composite sandwich structure 320 includes outer structural laminates 322a, 322b, circuit laminates 324a, 324b, and a core structure, generally indicated as 326. In the embodiment shown, core structure 326 includes angle-shaped truss elements 326a that extend across the width of composite sandwich structure 320. As can be seen in this embodiment, adjacent angle truss elements 326a are inverted relative to each other; however, it should be realized that the truss elements may also be all aligned in the same orientation or other orientations as may be desirable for the particular application. Truss elements 326a may be made out of structural laminates similar to structural laminates 322a, 322b and 22a, 22b, as discussed above, or may consist of other structural materials and/or metals. If metals are used, a low dielectric coating may also be provided on the truss elements. Composite sandwich structure 320 also includes electronic components 316 which may be located along the inner surfaces of circuit laminates 324a and 324b. In addition, electronic components 316 may also be placed upon other circuit laminates (not shown) or flexible circuit members (not shown) that may be attached or affixed to truss elements 326.

Figure 11:
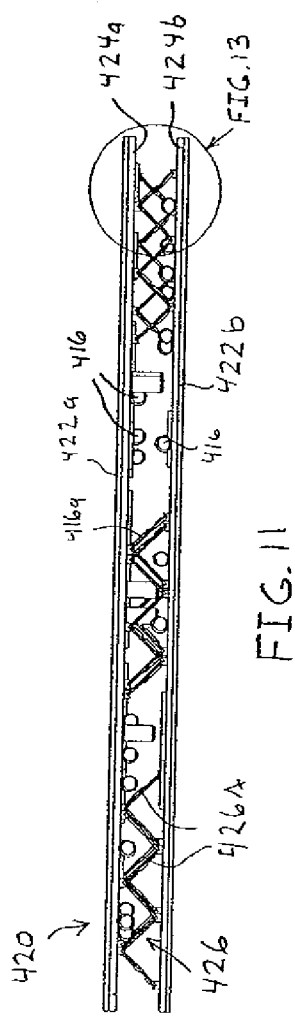
FIG. 11 is a side view of another embodiment of a composite sandwich structure of the present invention.
Figure 13:
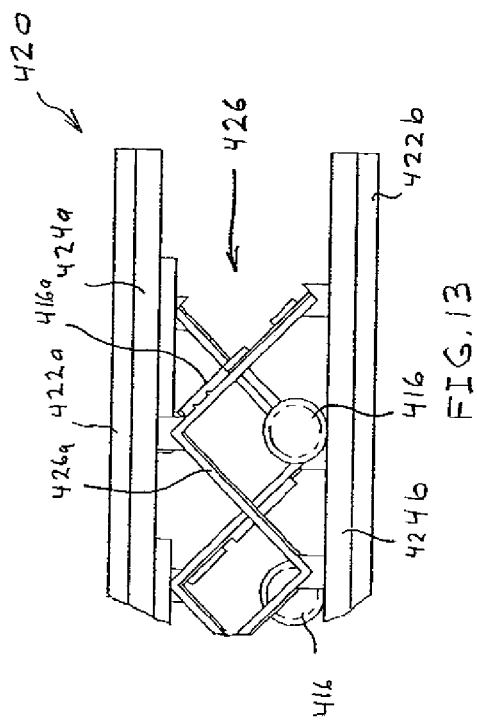
FIG. 13 is an enlarged view of a portion of the composite sandwich structure from the area indicated in FIG. 11.
Figure 12:
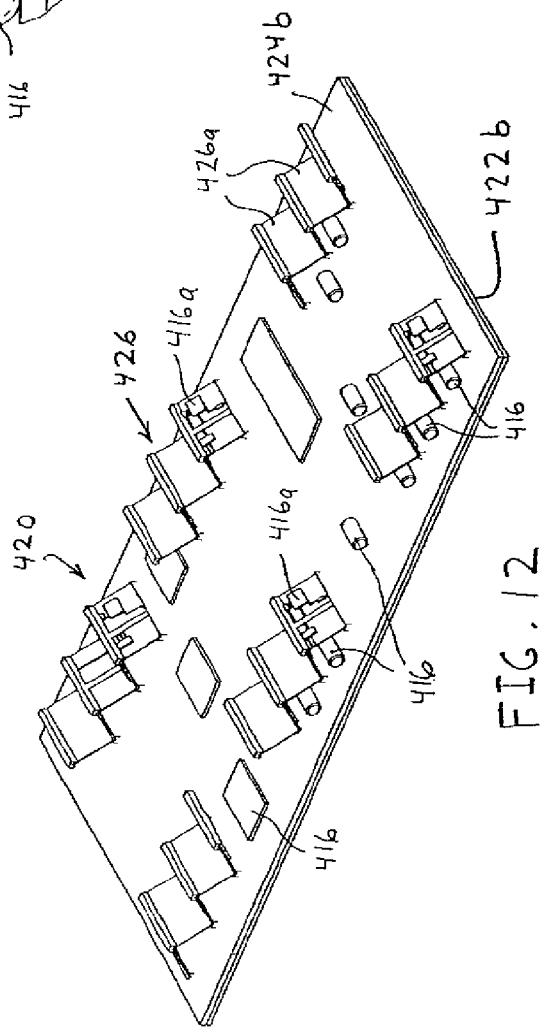
FIG. 12 is a perspective view of the composite sandwich structure of FIG. 11 with the top portion removed for clarity.

An additional embodiment of a composite sandwich structure, generally indicated as 420, is shown in FIGS. 11-13. Composite sandwich structure 420 includes outer structural laminates 422a, 422b, intermediate circuit laminates 424a, 424b, and a core structure, generally indicated as 426. Core structure 426 includes discrete angle-shaped truss elements 426a, and electronic components 416. Discrete truss elements 426a do not extend across the width of composite sandwich structure 320 in the embodiment shown, and may also include electronic components or devices 416a affixed to circuit laminates 424c, which may be attached and located where desired on truss elements 426a. It should be appreciated that discrete angle-shaped truss elements 326a may be placed where desired within composite sandwich structure 320 for structural support purposes or for the desired location of the electronics. It should also be appreciated that high density electronic components and circuitry may be used within such a composite sandwich structure and contained on the inner surfaces of circuit laminates 424a and 424b as well as on truss elements 426a.

Another embodiment of a composite sandwich structure, generally indicated as 520, is shown in FIGS. 14-16. Composite sandwich structure 520 includes outer structural laminates 522a, 522b, intermediate circuit laminates 524a, 524b, a core structure, generally indicated as 526, and electronic components 516. In this embodiment, the structural and circuit laminates may be similar as discussed above; however, core structure 526 includes a vertical truss or I-beam construction. The vertical truss core structure has a structural laminate 522c, which is sandwiched between circuit laminates 524c, 524d, that have electronic components or devices 516a mounted thereon. To electrically connect circuit laminates 524c, 524d to circuit laminates 524a, 524b, circuit connectors 525 are provided with ribbon cables 527 extending therebetween. Composite structure 520 also includes mounting members 529 for attaching and/or transferring stress to structural laminates 522a, 522b. Mounting members may be attached to laminates using known fastening means, such as bolts, screws, adhesives, or compression fit pins.

Now referring to FIGS. 17-19, another embodiment of a composite sandwich structure is shown, generally indicated as 620. Composite sandwich structure 620 includes electronic components or devices 616, outer structural laminates 622a, 622b, intermediate circuit laminates 624a, 624b, and a vertical truss or I-beam core structure, generally indicated as 626. The laminate structures may be as discussed above. Core structure 626 includes a web portion 622c, which may be a laminate or solid structure to provide rigidity and structural support to composite sandwich structure 620. The composite sandwich structure also includes flexible circuitry members 624c and 624d, which extend between circuit laminates 624a and 624b and are connected thereto with connectors 625a, 625b, respectively. Electronic components (not shown) may be mounted directly in flexible circuitry members 624c and 624d, or discrete electronic components 16 may also be mounted thereon. It should be appreciated that the specific location of the flexible circuitry members is for illustrative purposes only and that they may be located wherever desired in composite sandwich structure 620. Composite sandwich structure 620 also includes mounting members 629 for mounting core structure 626 to the laminates as discussed above for mounting core structure 526 to composite sandwich structure 520.

In another embodiment of the invention, a composite sandwich structure 720 is provided as shown in FIGS. 20-22. Composite sandwich structure 720 includes electronic component or circuitry 716, outer structure laminates 722a, 722b, intermittent circuit laminates 724a, 724b, and a core structure, generally indicated as 726. In this embodiment, core structure 726 includes a structural member 726a having a generally corrugated configuration with portions intermittently extending parallel and adjacent structure laminates 722a and 722b and with angled portions connecting the parallel portions. Composite sandwich structure 720 also includes circuit laminates 724c, 724d attached on opposite sides of the angled portions of corrugated member 726a. Circuit laminates 724c and 724d may include electronic components or devices 716a. Circuit laminates 724c are electrically connected to circuit laminates 724a with a ribbon cable 727a and circuit connectors 725a, 725b, respectively, and circuit laminates 724d are electrically connected to circuit laminates 724b with ribbon cables 727b and circuit connectors 727c, 727d, respectively. Additionally, circuit laminates 724c and 724d are connected to one another at ends of structural member 726a with a ribbon cable 731.

Now referring to FIGS. 23-25, a composite sandwich structure is generally indicated as 820. Composite sandwich structure 820 includes outer structural laminates 822a, 822b, a flexible circuitry film 824a which is known and may be made from a polyamid or other type film having conductive tracings and surface mount electronics thereon, and a core structure, generally indicated as 826. Core structure 826 includes a structural member 826a having a generally corrugated shape in the embodiment shown similar to structural member 726a of composite sandwich structure 720. Core structure 826 also includes circuit laminates 824b, 824c similar to circuit laminates 724c, 724d on composite sandwich structure 720. Circuit laminates 824b, 824c have electronic components 816a located thereon. In addition to providing increased area for housing electronic components, flex circuitry film 824a also serves to electrically connect circuit laminates 824b to one another and to connect circuit laminates 824c to one another. Electrical connections between circuit laminates 824b and 824c on opposite sides of structural member 826a are facilitated by ribbon cables 831.

Still yet another embodiment of a composite sandwich structure of the present invention is generally indicated as 920 in FIGS. 26-28. Composite sandwich structure 920 is similar in all respects to composite sandwich structure 820, except that composite sandwich structure 920 also includes foam or other supporting members 936 and 936a for supporting the flexible circuitry film. Supporting members 936 and 936a protect the flexible circuitry film and may also provide additional structural support for composite sandwich structure 920.

Referring now to FIGS. 29 and 30, another embodiment of a composite sandwich structure of the present invention is generally indicated as 1020. Composite sandwich structure 1020 includes electronic components or devices 1016, outer structural laminates 1022a, 1022b, intermediate circuit laminates 1024a, 1024b, and a core structure, generally indicated as 1026. Core structure 1026 includes structural members 1026a, which in the embodiment shown have a hexagonal configuration, which can be set in a honeycombed configuration as shown in FIG. 30. Structural members 1026a may be used to isolate selected electronic components 1016, and electronic components and/or circuitry 1016a may be attached to structural members 1026a to increase the circuit density of the composite sandwich structure. It should be appreciate that structural members 1026a may be arranged in any desired configuration including the honeycomb and aligned configurations shown in FIG. 30 or may be set randomly or at any other desired pattern. Additionally, structural members 1026a may be a structural laminate or other suitable structural material. If an electrically conducted metal is used for structural members 1026a, they may be covered with a low dielectric material to accept electronic components and/or circuit 1016a.

While the invention has been taught with specific reference to the above-described embodiments, one skilled in the art will recognize that changes can be made in form and detail without departing from the spirit and scope of the invention. For example, single layered structures may be substituted when appropriate for any of the laminate structures described above. Also, any suitable configuration may be employed for trusses contained in the core of the composite sandwich structure. For instance, rectangular, box, hat-shaped, cylindrical, semi-cylindrical, honeycomb, hexagonal, etc., types of shapes may be used for the trusses. Furthermore, the length and orientation of the trusses may be varied, and the trusses may also be used to isolate selected electronic components. Also, trusses may be set apart or clustered together as desired. As such, the described embodiments are to be considered in all respects only as illustrative and not restrictive. The scope of the invention is, therefore, indicated by the following claims rather than by the description. Additionally, all changes that come within the equivalency of the claims are to be embraced within their scope.

The invention claimed is:

1. A load carrying structure comprising:
   a bulkhead or other structural load carrying member that is subjected to substantial externally applied structural loads; and
   a composite sandwich structure that is attached to, embedded within, or part of said bulkhead or load carrying member, which is carrying a portion of the said structural load, and the composite sandwich structure including:
   first and second multilayer composite facesheet laminates made of structural fiber reinforced material;
   first and second multilayer circuit laminates made of low dielectric fiber reinforced material with electrically conducting printed circuits embedded between low dielectric plies;
   a core structure having a substantially honeycomb, cellulose or cellular foam construction; and
   electronic components located in a central core region where said core structure is located and surrounded on at least three sides by said core structure and having electrical conducting contacts secured to said printed circuits within either of said multilayer circuit laminates.

2. The load carrying structure of claim 1, wherein said structural fiber reinforced material includes at least one of a carbon, ceramic, glass, or polymer.

3. The load carrying structure of claim 1, wherein said structural fiber reinforced material is a matrix material including thermoset polymer or thermoplastic polymer.

4. The load carrying structure of claim 1, wherein said circuit laminates include reinforcement fibers that are woven or non-woven low dielectric material.

5. The load carrying structure of claim 1, wherein said circuit laminates include fiber reinforced matrix material with a low dielectric thermoset polymer, thermoplastic polymer, ceramic, or ceramic particulate filled polymer.

6. The load carrying structure of claim 1, wherein said first and second multilayer circuit laminates are located on opposite sides of said core structure, and said multilayer circuit laminates and said core structure are sandwiched between said first and second multilayer composite facesheet laminates, and said composite sandwich structure carries a portion of the applied structural load in said bulkhead or load carrying member, beyond the forces induced from the weight, expansion/contraction or distortion of said composite sandwich structure and any incidental loads to which said composite sandwich structure may be exposed to.

7. The load carrying structure of claim 6, wherein said first multilayer composite facesheet laminate is bonded to said first multilayer circuit laminate, and said second multilayer composite facesheet laminate is bonded to said second multilayer circuit laminate.

8. The load carrying structure of claim 7, wherein said multilayer composite facesheet laminates are bonded to said multilayer circuit laminates with a resin that is subsequently cured.

9. The load carrying structure of claim 7, wherein said multilayer composite facesheet laminates are bonded to said multilayer circuit laminates using an adhesive after said laminates have been cured.

10. The load carrying structure of claim 1, wherein said electronic components include redundant circuitry and components, which are activated if equivalent components or circuitry have malfunctioned or failed.

11. The load carrying structure of claim 10, further including a signal control device to sense if the equivalent components of circuitry have malfunctioned or failed and a switch to electronically reconfigure the circuitry to isolate the equivalent components or circuitry that have malfunctioned or failed and activate said redundant circuitry and components.

12. The load carrying structure of claim 1, further including at least one heat sink lead thermally connected to a heat generating electronic component within the composite sandwich structure and thermally connected to a heat sink outside the composite sandwich structure.

13. The load carrying structure of claim 12, wherein said heat sink lead extends through said core structure and out of the composite sandwich structure therefrom.

14. The load carrying structure of claim 12, wherein said heat sink lead extends through one of said first or second multilayer circuit laminates and one of said first or second multilayer facesheet laminates.

* * * * *